(12) United States Patent
Haven et al.

(10) Patent No.: US 10,875,812 B2
(45) Date of Patent: Dec. 29, 2020

(54) TRANSPARENT CERAMIC WITH COMPLEX GEOMETRY

(71) Applicant: SAINT-GOBAIN CERAMICS & PLASTICS, INC., Worcester, MA (US)

(72) Inventors: Drew T. Haven, Milford, NH (US); Steven A. Zanella, Dublin, NH (US); William J. Drouin, Brookline, NH (US)

(73) Assignee: SAINT-GOBAIN CERAMICS & PLASTICS, INC., Worcester, MA (US)

( * ) Notice: Subject to any disclaimer, the term of this patent is extended or adjusted under 35 U.S.C. 154(b) by 132 days.

(21) Appl. No.: 15/294,375

(22) Filed: Oct. 14, 2016

(65) Prior Publication Data

US 2017/0107154 A1    Apr. 20, 2017

Related U.S. Application Data

(60) Provisional application No. 62/242,800, filed on Oct. 16, 2015.

(51) Int. Cl.

| | |
|---|---|
| *C04B 35/10* | (2006.01) |
| *B28B 11/00* | (2006.01) |
| *C30B 29/38* | (2006.01) |
| *C30B 33/00* | (2006.01) |
| *C30B 29/26* | (2006.01) |
| *C30B 29/20* | (2006.01) |

(Continued)

(52) U.S. Cl.
CPC ............ *C04B 35/10* (2013.01); *B28B 11/005* (2013.01); *C01F 7/021* (2013.01); *C04B 35/622* (2013.01); *C30B 29/20* (2013.01); *C30B 29/26* (2013.01); *C30B 29/38* (2013.01); *C30B 33/00* (2013.01); *C04B 2235/3217* (2013.01); *C04B 2235/656* (2013.01); *C04B 2235/9653* (2013.01); *C30B 15/34* (2013.01)

(58) Field of Classification Search
CPC .................. C04B 35/10; C04B 35/622; C04B 2235/3217; C04B 2235/656; C04B 2235/9653; Y10T 428/24479; Y10T 428/24545; Y10T 428/24595; Y10T 428/24628; Y10T 428/34942; Y10T 428/2495; Y10T 428/24992
USPC ....... 428/156, 164, 170, 174, 186, 212, 213, 428/218, 220
See application file for complete search history.

(56) References Cited

U.S. PATENT DOCUMENTS

| | | |
|---|---|---|
| 4,347,210 A | 8/1982 | Maguire et al. |
| 5,089,455 A | 2/1992 | Ketcham et al. |

(Continued)

FOREIGN PATENT DOCUMENTS

| | | |
|---|---|---|
| CN | 1071362 A | 4/1993 |
| CN | 101219554 A | 7/2008 |

(Continued)

*Primary Examiner* — Frank J Vineis
(74) *Attorney, Agent, or Firm* — Abel Schillinger, LLP; Robert N Young (57) ABSTRACT

A ceramic product includes a transparent ceramic panel having a non-planar geometry including a bend having a slippage plane, an increased haze, a non-uniform thickness, or a combination thereof. A method includes providing a transparent ceramic panel, heating the panel, bending the panel to conform to a non-planar geometry.

17 Claims, 6 Drawing Sheets

(51) Int. Cl.
    *C01F 7/02*     (2006.01)
    *C04B 35/622*     (2006.01)
    *C30B 15/34*     (2006.01)

(56) References Cited

U.S. PATENT DOCUMENTS

| | | |
|---|---|---|
| 7,348,076 B2 | 3/2008 | Locher et al. |
| 8,297,168 B2 | 10/2012 | Jones et al. |
| 8,685,161 B2 | 4/2014 | Locher et al. |
| 8,865,300 B2 | 10/2014 | Mannheim Astete et al. |
| 2008/0164402 A1 | 7/2008 | Menke et al. |
| 2008/0187721 A1 | 8/2008 | Engl |
| 2009/0061213 A1 | 3/2009 | Bahnmuller et al. |
| 2010/0003492 A1* | 1/2010 | D'Evelyn ............... B28D 5/00 |
| | | 428/220 |
| 2010/0263525 A1 | 10/2010 | Siebers et al. |
| 2011/0062469 A1 | 3/2011 | Camras et al. |
| 2012/0028015 A1 | 2/2012 | Langsdort et al. |
| 2012/0058303 A1 | 3/2012 | Gabel et al. |
| 2012/0198989 A1 | 8/2012 | Varshneya et al. |
| 2014/0030443 A1* | 1/2014 | Prest ...................... B41M 5/24 |
| | | 427/555 |
| 2014/0079909 A1 | 3/2014 | Sanghera et al. |
| 2014/0311402 A1 | 10/2014 | Ouellette et al. |
| 2014/0360345 A1 | 12/2014 | Schnetter et al. |
| 2015/0311388 A1* | 10/2015 | Shimooka ............ H01L 33/007 |
| | | 257/615 |

FOREIGN PATENT DOCUMENTS

| | | |
|---|---|---|
| CN | 101462820 A | 6/2009 |
| CN | 101755493 A | 6/2010 |
| CN | 101882558 A | 11/2010 |
| CN | 102347432 A | 2/2012 |
| JP | S62204293 A | 9/1987 |

\* cited by examiner

TRANSPARENT CERAMIC WITH COMPLEX GEOMETRY

CROSS-REFERENCE TO RELATED APPLICATION(S)

This application claims priority under 35 U.S.C. § 119(e) to U.S. Patent Application No. 62/242,800 entitled "TRANSPARENT CERAMIC WITH COMPLEX GEOMETRY," by Drew T. Haven, Steven A. Zanella and William J. Drouin, filed Oct. 16, 2015, which is assigned to the current assignee hereof and incorporated herein by reference in its entirety.

GOVERNMENT LICENSE RIGHTS

This invention was made with United States Government support under Contract Number FA8650-11-D-5703 awarded by Air Force Research Laboratory to Universal Technology Corporation, and under Contract Number 13-S7507-02-C1 between Universal Technology Corporation and Saint-Gobain Ceramics and Plastics, Inc. The United States Government has certain rights in the invention.

FIELD OF THE DISCLOSURE

The present disclosure relates to ceramic materials, and methods of making ceramic materials, and more particularly to transparent ceramic materials having a complex geometry.

BACKGROUND

Transparent ceramics include high-strength, robust materials that have the capacity to transmit light. Although in certain applications, it may be desirable for transparent ceramics to have a complex geometry, such may be difficult to achieve due to the low flexibility of transparent ceramics. There exists a need for an improved transparent ceramic material with complex geometry.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the ceramic arts.

A ceramic material can exhibit a variety of mechanical properties useful in products subjected to, for example, abrasion, high temperatures, or high speed impacts. For example, an excellent strength to weight ratio and superior hardness mean that ceramics can often replace and improve on structural materials such as steel, polymers and glass.

A ceramic material can be opaque, translucent or transparent. A transparent ceramic material is of particular interest because it can provide an impact resistant, scratch resistant and heat resistant material that can replace transparent glass or polymers. While sheets of transparent ceramic material are typically more difficult to produce than are glass or polymeric sheets, the superior properties of such ceramic material may make them the material of choice where scratch resistance, high strength, and transmission of light are desired under extreme conditions or in harsh environments, or where transmission is required at wavelengths not possible with glass or polymers.

A "translucent" ceramic material is known to those skilled in the art and allows the transmission of light but does not provide for a clear image of objects viewed through the material, whereas a "transparent" ceramic material is known to those skilled in the art and allows for transmission of light and provides a clear, discernable image of objects viewed through the material.

A transparent ceramic material can be stiff and brittle, making it difficult to bend a flat transparent ceramic panel into a transparent ceramic panel having a complex geometry. Thus, existing technology has attempted to achieve transparent ceramic panels with complex geometries by cutting the desired geometry from a boule or forming directly into near-net shapes using green body formation techniques. However, such methods can be costly and time consuming. Further, such materials still require polishing over the complex geometry as opposed to polishing a flat panel prior to bending.

Certain embodiments of the ceramic product disclosed herein have the significant advantage including a transparent ceramic panel initially formed in a flat or non-planar geometry and then bent to conform to a complex geometry. Further embodiments of the ceramic product disclosed herein have the significant advantage that the transparent ceramic panel can be polished prior to bending and retain at least a portion of the polish after bending.

In certain embodiments, the ceramic product can include a transparent ceramic panel bent to conform to a complex geometry. Prior to bending, the transparent ceramic panel can have a flat or planar geometry. In certain embodiments, the transparent ceramic panel can include a single continuous ceramic sheet rather than a mosaic or series of sheets adjoined edge to edge.

In certain embodiments, the transparent ceramic panel can include a polycrystalline or monocrystalline ceramic material. In some cases the panel may be a sintered ceramic sheet although single crystal ceramics are often preferred due to, for example, superior optical qualities, better resiliency, or both. Non-exhaustive examples of suitable ceramic materials include a polycrystalline $Al_2O_3$, a monocrystalline sapphire ($Al_2O_3$), an aluminum oxynitride such as $(AlN)_x$ $(Al2O3)_{1-x}$, where x is in a range of 0 to 1, or even 0<x<1, (hereinafter "AlON"), and a spinel ($MgAl_2O_4$). In particular embodiments, the transparent ceramic panel can include a sapphire having a major surface that lies along an a-plane or a major surface that lies along a c-plane.

The transparent ceramic panel prior to bending, such as with the flat or non-planar geometry, can be produced from cross-sections of a boule. However, ceramic sheets produced from cross-sections of a boule may be limited in that a boule is typically cylindrical and thus has a circular cross-section. Therefore, a ceramic sheet cut from a boule generally has a width that is limited to the diameter of the boule. While square sheets can be cut with minimal waste, rectangular sheets may be more costly to make and may involve additional cuts, with corresponding waste, in order to produce ceramic sheets having a length greater than the width. Although different shapes can be sliced from a boule, cutting sheets from a block of transparent ceramic can be expensive and time consuming.

In some embodiments, the use of single ceramic sheets of greater surface area may result in improved performance by, for example, more effectively dispersing an impact force and also providing an improved field of vision. Larger area sheets can be made using a Stepanov (SP) technique or an Edge-defined Film-fed Growth (EFG) methods. EFG techniques are not limited to, but can include, those described in commonly-owned U.S. Pat. No. 7,348,076 by Locher et al. titled "Single Crystals and Methods for Fabricating Same," granted on Mar. 25, 2008, which is incorporated by reference herein in its entirety.

In certain embodiments, the transparent ceramic panel can have a length of at least 30 cm, at least 35 cm, at least 40 cm, at least 45 cm, or even at least 50 cm. In particular embodiments, using growth techniques, the transparent ceramic panel can have a length of at least 60 cm, or at least 70 cm, or at least 95 cm. Length refers to the dimension that is greater than or equal to the width and thickness.

In further embodiments, the transparent ceramic panel can have a width that is less than the length (or equal to the length in a square configuration) and may be less than or equal to 90%, 80%, 70% or 60% of the length. In particular embodiments, the transparent ceramic panel can have a width of at least 10 cm, at least 15 cm, or even at least 20 cm.

In further embodiments, the transparent ceramic panel can have a thickness that is less than or equal to the width of the transparent ceramic panel. For example, the thickness can be substantially consistent prior to bending, and can be at least 0.05 cm, at least 0.07 cm, at least 0.1 cm, at least 0.2 cm, at least 0.3 cm, at least 0.4 cm, at least 0.5 cm, at least 0.7 cm, or even at least 1 cm. Similarly, the sheets may have a thickness of no greater than 0.05 cm, no greater than 0.07 cm, no greater than 0.1 cm, no greater than 0.2 cm, no greater than 0.3 cm, no greater than 0.4 cm, no greater than 0.5 cm, no greater than 0.7 cm, no greater than 1 cm, no greater than 2 cm, or even no greater than 3 cm.

In some embodiments, the transparent ceramic panel, prior to bending, can be formed in a substantially round or arcuate shape or any polygonal shape. In particular embodiments, the polygonal shape includes a square or rectangle. In further particular embodiments, the transparent ceramic panel can include other shapes, such as a rod. Moreover, the transparent ceramic panel can have a surface area of at least 650 $cm^2$, at least 850 $cm^2$, at least 1050 $cm^2$, at least 1250 $cm^2$, at least 1450 $cm^2$, or at least 1650 $cm^2$, or greater than 1650 $cm^2$.

In certain embodiments the transparent ceramic panel can allow transmission of greater than 25%, 50%, 70%, 80%, or 90%, of visible, infrared and/or ultraviolet light. Although an even greater transmission may be desired, the transparent ceramic panel may have a transmission of no greater than 97%, no greater than 95%, or even no greater than 93%. Significant transmission of wavelengths down to about 200 nm and up to about 2 to 3 μm can also be achieved. For example, depending on the material, the transparent ceramic material can transmit at least 80% for wavelengths of up to at least 4 μm, at least 60% for wavelengths of up to at least 5 μm, and up to about 60% for wavelengths in a range of 5 to 7 μm. For example, sapphire, spinel, and AlON can have a transmission of light as described in Kim et al., "Ceramic windows and gain media for high-energy lasers," *Opt. Eng.* 52(2), 021003 (Oct. 5, 2012), which is incorporated herein by reference for the transmission of transparent ceramic materials including FIG. 1 of the article and the related text. The light transmission values can be measured according to a method known to a person of ordinary skill in the art.

In certain embodiments, the ceramic product can include a transparent ceramic panel, after bending, having a complex geometry. As discussed previously, the transparent ceramic panel can have a planar geometry and can be bent from a planar geometry to conform to a complex geometry. As used herein, the term "complex geometry" refers to a geometry that is non-planar having at least one bend. In particular embodiments, the complex geometry of the transparent ceramic panel can include at least two bends, at least three bends, or at least four bends. In certain embodiments, the bend can have any radius of curvature achieved from bending a flat piece. In further embodiments, the bend can have a radius of curvature of no greater than 120 cm, no greater than 100 cm, no greater than 80 cm, no greater than 60 cm, no greater than 40 cm, or even no greater than 30 cm.

The non-planar geometry can include an artifact of the bending process in the bend. For example, the bend can exhibit a slippage plane, a variation in dislocation density, an increased haze, a non-uniform thickness, or a combination thereof. For example, the slippage plane refers to a plastic deformation in the crystal structure of the transparent ceramic panel. The deformation can be a result of dislocations caused by sequential bond breaking and bond reforming during bending. The presence or absence of a slippage plane can be determined based on observation using x-ray topography (XRT) analysis.

Further, the slippage plane can have a dislocation density including a number of dislocations per unit area or volume. In certain embodiments, the complex geometry can have a variation in dislocation density caused by the bending process. For example, the complex geometry can include an increased or decreased dislocation density at the edges or an increased or decreased density at the apex of the bend. Complex geometries formed from directly a boule or green body formation techniques without bending are believed to not have such a dislocation density variation.

The dislocation density can be determined by calculating the number of dislocation lines crossing a unit area of 1 cm$^2$. In an embodiment, the conformed panel can have a region of low dislocation density and a region of high dislocation density, each having a unit area of 1 cm$^2$. In an embodiment, the region of low dislocation density can have a dislocation density of at most 500, or at most 100, or at most 50, or at most 10 dislocation lines per cm$^2$, and can include 0 dislocation lines per cm$^2$. The region of high dislocation density has a dislocation density greater than the region of low dislocation density. In an embodiment, the region of high dislocation density can have a dislocation density of at least $10^6$, or at least $10^7$, or at least $10^8$, or at least $10^9$, or at least $10^{10}$ dislocation lines per cm$^2$. In an embodiment, while there is not necessarily a limit to the number of dislocation lines per cm$^2$, a region of high dislocation density can include at most $10^{15}$ dislocation lines per cm$^2$. In a further embodiment, the dislocation density of a unit area region may be difficult to determine due to the high number of dislocation lines in the unit area. Such a region having too many dislocation lines to count may also be considered a region of high dislocation density.

Further, the transparent ceramic panel can include an increased haze at the bend. As used herein, the term "haze" refers to the scattering of light as it passes through a transparent material, resulting in a reduction in visibility or glare and can be measured according to ASTM D1003. The haze can result from the bending of the ceramic material and, thus, be localized at the bend. In certain embodiments, the bend in the transparent ceramic panel can exhibit a haze variation at the bend. For example, the bend can have an increased haze relative to the edges of the panel. In particular embodiments, the bend can have a haze in a range of at least 1%, at least 2%, or at least 3%. In further particular embodiments, the bend can have a haze in a range of no greater than 10%, no greater than 7%, or no greater than 5%. Similarly, complex geometries formed directly from a boule or green body formation techniques without bending are believed to not have such a localized increase in haze at the bend.

Furthermore, the transparent ceramic panel can include a non-uniform thickness. A non-uniform thickness refers to a thickness variation at the bend as a result of the bending. For example, as the panel is bent, the material at the apex of the bend can reduce in thickness relative to the area adjacent the bend, or the material adjacent the bend can increase in thickness relative to the apex of the bend. In an embodiment, the thickness variation includes a thickness that decreases approaching an apex of the bend. In certain embodiments, the thickness variation can be calculated by finding the difference between a thickness measured at the apex of the bend and a thickness measured at a point set apart 1 cm from the apex of the bend. In particular embodiments, the difference in thickness can be at least 0.1%, at least 0.5%, or at least 1%. In further particular embodiments, the difference in thickness may be no greater than 10%, no greater than 5%, or no greater than 3%. Similarly, complex geometries formed directly from a boule or green body formation techniques without bending are believed to not have such a localized thickness variation at the bend.

Furthermore, the transparent ceramic panel can exhibit strain or distortion due to strain in the conformed product, which can be observed using XRT analysis.

In particular embodiments, the ceramic product can include a polished transparent ceramic panel having a complex geometry. Further, the transparent ceramic panel can be polished prior to bending and can retain its polish after bending.

As discussed previously, existing technology has attempted to achieve complex geometries by cutting the desired geometry from a boule or forming the material using green body formation techniques in near-net shapes. However, such materials still require polishing after achieving the complex geometry, which can be costly and time consuming. Applicant has developed a method of forming a ceramic product that does not require cutting from a boule or green body formation techniques to achieve a complex geometry. The method can include a transparent ceramic panel formed from any growth technique. In certain embodiments, the method includes producing the panel from a growth technique such as EFG or SP techniques discussed above. In further embodiments, the panel can be cut from a boule or formed using a green-body formation technique. As discussed above, the method does not require cutting from a boule or forming using a green-body formation technique. For example, the method does not comprise producing the transparent ceramic panel from a boule, or the method does not comprise producing the transparent ceramic panel from any green-body formation technique.

In particular embodiments, providing the transparent ceramic panel comprises providing a planar or flat transparent ceramic panel, that is prior to bending. In further embodiments, providing the transparent ceramic panel includes polishing the transparent ceramic panel prior to bending. Moreover, the method includes the transparent ceramic panel retains its polish after bending.

In certain embodiments, the method can include providing a transparent ceramic panel, heating the panel, bending the panel to conform to the complex geometry. Although providing a transparent ceramic panel can include any technique for achieving a transparent ceramic panel, a transparent ceramic panel achieved by a growth technique, which may provide a transparent ceramic panel having advantages over sheets formed using other techniques.

Although the method does not require the panel to be polished, the method disclosed herein allows for the panel to be polished prior to bending and retain its polish after bending.

Figure 1:
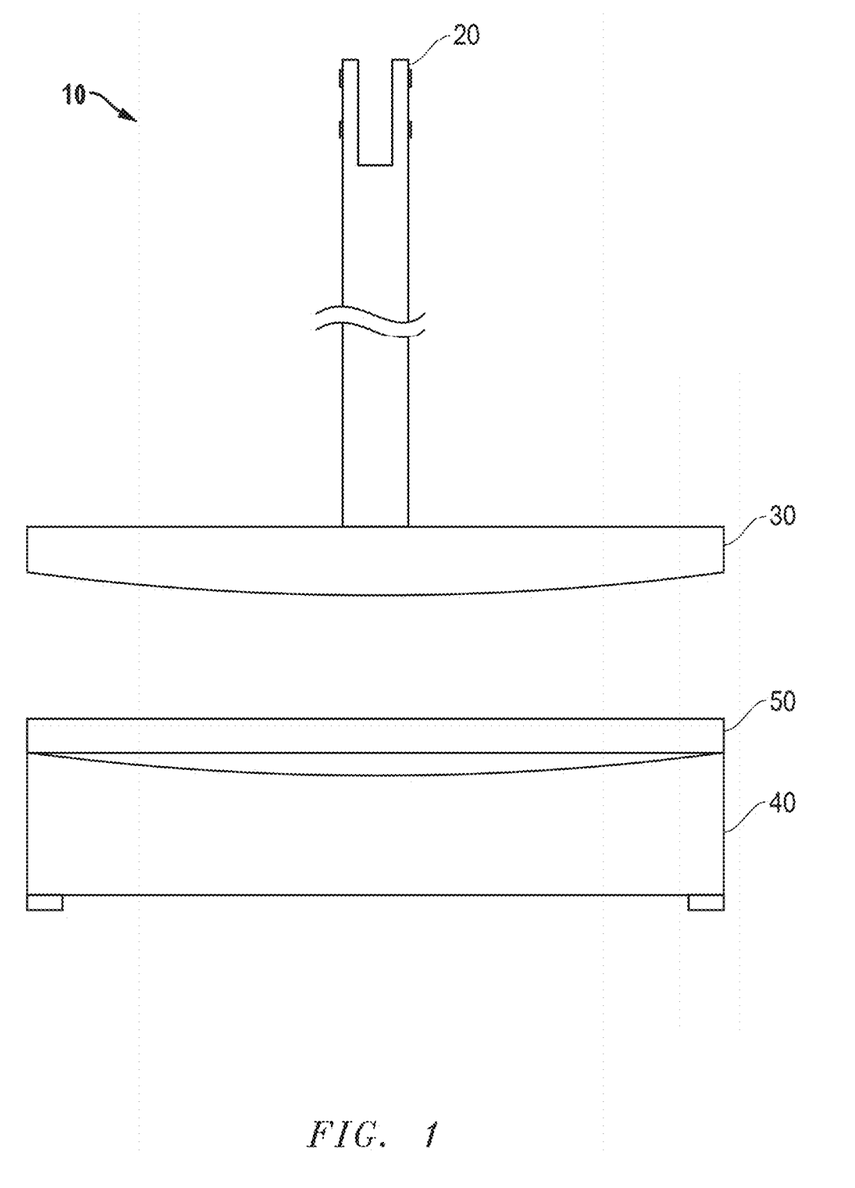
FIG. 1 includes an illustration of a bending jig that can be used in embodiments of the method described herein.

In particular embodiments, a polished transparent ceramic panel can be placed between bend jigs. The bend jigs can include polished bend jigs formed of any high temperature refractory metal so long as it maintains its strength at the bending temperatures. In certain embodiments, the refractory metal can include a tungsten, an iridium, a molybdenum, a rhenium, any alloy thereof, or any combination thereof. The bend jigs may be part of a bend jig assembly 10 as illustrated in FIG. 1, including a jig attachment point 20, a movable jig 30, and a stationary jig 40. A transparent ceramic panel 50 can be placed between the movable jig 30 and the stationary jig 40. The movable jig and the stationary jig can define the complex geometry in a complementary manner.

After placing the transparent ceramic panel in the jig assembly, the jig assembly can be heated to a temperature below the melting point of the transparent ceramic panel. If the temperature is too low, the transparent ceramic panel will not have sufficient plasticity to bend and can crack. For example, heating the panel can include heating the jig assembly to a temperature of at least 500° C. below a melting point of the panel, at least 100° C. below a melting point of the panel, at least 60° C. below a melting point of the panel, at least 20° C. below a melting point of the panel, or even at least 10° C. below a melting point of the panel. However, if the temperature is too high, the transparent ceramic panel will begin to melt and lose all structure. Heating the panel can include heating the panel at a temperature of no greater than 0.01° C. below a melting point of the panel, no greater than 1° C. below a melting point of the panel, no greater than 3° C. below a melting point of the panel, or no greater than 5° C. below a melting point of the panel. In particular embodiments, at least a portion of the panel may be heated to its melting point so long as portions of the panel stay below its melting point. Further, the jig assembly can include an insulation such as a carbon insulation.

Upon heating the jig assembly to the desired temperature, the transparent ceramic panel can be pressed between the two jigs 30 and 40. The high temperature allows for the transparent ceramic panel to deform by slip into the complex geometry. As discussed above, the complex geometry can include a non-planar geometry that includes a bend. The bend can exhibit a slippage plane, an increased haze, a non-uniform thickness, or a combination thereof, as a result of the bending process. Further, the material used for the jigs can allow the transparent ceramic panel to maintain at least a portion of the polish with minimal post processing.

As discussed above, the ceramic product can include a transparent ceramic panel bent to conform to a complex geometry. In certain embodiments, the complex geometry can be designed for transparent armor applications. In further embodiments, the complex geometry can be designed for electro-optic windows. A ceramic product made according to the above methods can produce such geometries in an efficient manner and without excess waste of materials.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

A ceramic product comprising a transparent ceramic panel having a non-planar geometry including a bend, having at the bend a haze variation, a thickness variation, a dislocation density variation, or any combination thereof.

Embodiment 2

A method of forming a ceramic product comprising:
providing a transparent ceramic panel;
heating the panel; and
bending the panel to conform to a non-planar geometry.

Embodiment 3

The method of embodiment 2, wherein the non-planar geometry includes a bend, having at the bend a haze variation, a thickness variation, a dislocation density variation, or any combination thereof.

Embodiment 4

The method of any one of embodiments 2-3, wherein the transparent ceramic panel has a planar geometry prior to bending.

Embodiment 5

The method of any one of embodiments 2-4, wherein providing the transparent ceramic panel comprises polishing the transparent ceramic panel prior to bending.

Embodiment 6

The method of embodiment 5, wherein the transparent ceramic panel retains at least a portion of the polish after bending.

Embodiment 7

The method of any one of embodiments 2-6, wherein heating the panel includes heating the panel at a temperature of at least 500° C. below a melting point of the panel, at least 100° C. below at melting point of the panel, at least 60° C. below a melting point of the panel, at least 20° C. below a melting point of the panel, or even at least 10° C. below a melting point of the panel.

Embodiment 8

The method of any one of embodiments 2-7, wherein heating the panel includes heating the panel at a temperature of no greater than 0.01° C. below a melting point of a panel, no greater than 1° C. below a melting point of the panel, no greater than 3° C. below a melting point of the panel, or no greater than 5° C. below a melting point of the panel.

Embodiment 9

The method of any one of embodiments 2-8, wherein bending the panel to conform to a non-planar geometry includes applying a load with a bending jig having the non-planar geometry.

Embodiment 10

The method of any one of embodiments 2-9, wherein providing the transparent ceramic panel comprises growing the panel using an Edge-Defined Film-Fed Growth (EFG) technique or a Stepanov (SP) technique, producing the transparent ceramic panel from a boule, or producing the transparent ceramic panel from a green-body formation technique.

Embodiment 11

The method of any one of embodiments 2-9, wherein the method does not comprise producing the transparent ceramic panel from a boule.

Embodiment 12

The method of any one of embodiments 2-9, wherein the method does not comprise producing the transparent ceramic panel from any green-body formation technique.

Embodiment 13

The ceramic product or method of any one of embodiments 1 and 3-12, wherein the non-uniform thickness includes a thickness that decreases approaching an apex of the bend.

Embodiment 14

The ceramic product or method of any one of embodiments 1 and 3-13, wherein the non-planar geometry includes at least two bends, at least three bends, or at least four bends.

Embodiment 15

The ceramic product or method of any one of the preceding embodiments, wherein the ceramic product is polished.

Embodiment 16

The ceramic product or method of any one of the preceding embodiments, wherein the ceramic product includes a monocrystalline transparent ceramic material.

Embodiment 17

The ceramic product or method of any one of the preceding embodiments, wherein the ceramic product includes a polycrystalline transparent ceramic material.

Embodiment 18

The ceramic product or method of any one of the preceding embodiments, wherein the ceramic product includes a transparent ceramic material comprising a sapphire, an AlON, or a spinel.

Embodiment 19

The ceramic product or method of embodiment 18, wherein the ceramic product includes a transparent ceramic material comprising a sapphire.

Embodiment 20

The ceramic product or method of embodiment 19, wherein the sapphire comprises a major surface that lies along an a-plane or a c-plane.

Embodiment 21

The ceramic product or method of any one of the preceding embodiments, wherein the non-planar geometry has a radius of curvature of no greater than 120 cm, no greater than 100 cm, no greater than 80 cm, no greater than 60 cm, no greater than 40 cm, or even no greater than 30 cm.

Embodiment 22

The ceramic product or method of any one of the preceding embodiments, wherein the transparent ceramic panel, prior to bending, has a length of at least 30 cm, at least 35 cm, at least 40 cm, at least 45 cm, or even at least 50 cm.

Embodiment 23

The ceramic product or method of any one of the preceding embodiments, wherein the transparent ceramic panel, prior to bending, has a width of at least 10 cm, at least 15 cm, at least 20 cm, or even at least 100 cm.

Embodiment 24

The ceramic product or method of any one of the preceding embodiments, wherein the transparent ceramic panel has a surface area of at least 650 $cm^2$, at least 850 $cm^2$, at least 1050 $cm^2$, at least 1250 $cm^2$, at least 1450 $cm^2$, or at least 1650 $cm^2$.

Embodiment 25

The ceramic product or method of any one of the preceding embodiments, wherein the ceramic product includes a region of low dislocation density and a region of high dislocation density, wherein the region of high dislocation density has a dislocation density of at least $10^6$, or at least $10^7$, or at least $10^8$, or at least $10^9$, or at least $10^{10}$ dislocation lines per $cm^2$.

Embodiment 26

The ceramic product or method of any one of the preceding embodiments, wherein the region of low dislocation density has a dislocation density of at most 500, or at most 100, or at most 50, or at most 10 dislocation lines per $cm^2$, Embodiment 27

A ceramic armor subcomponent comprising the ceramic product of any one of the preceding embodiments.

Embodiment 28

A window comprising the ceramic product of any one of the preceding embodiments.

EXAMPLE

An XRT analysis was performed on three different samples: Sample 1, Sample 2, and Sample 3.

Figure 2:
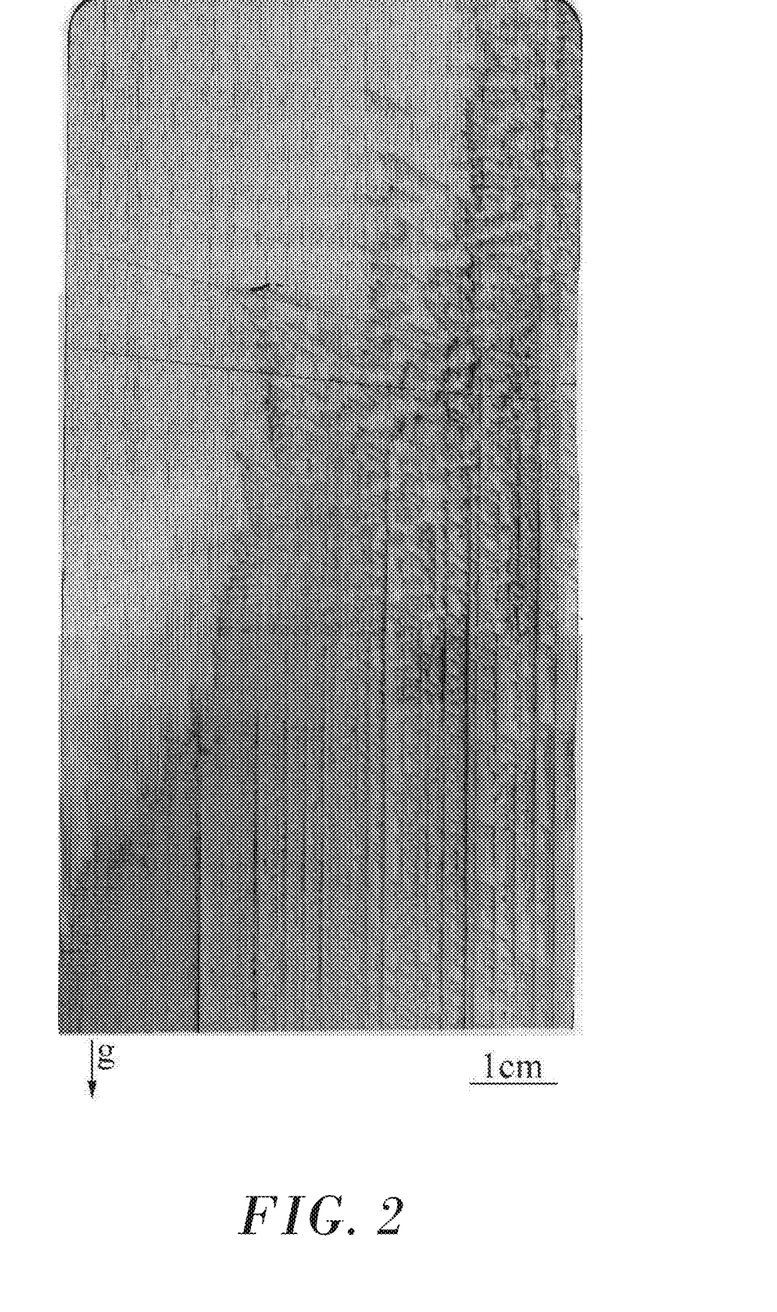
FIG. 2 includes an XRT image of Sample 1 of the Example section before any conformal bending.

FIG. 2 includes an XRT image of Sample 1, which was a flat, polished sapphire panel with the m-axis parallel to the long edge, having a thickness of about 0.076 cm, and annealed at 1850° C. for 8 hours. Only a few regions of dislocation and pyramidal slip are shown and there are no regions of strain that distort the image.

Figure 3:
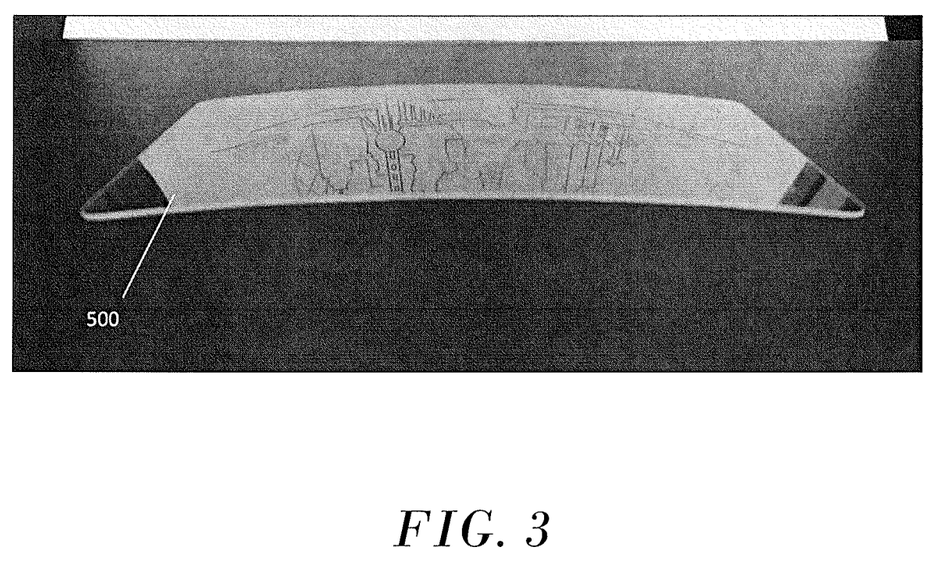
FIG. 3 includes a photograph of Sample 2 of the Example section.
Figure 4A:
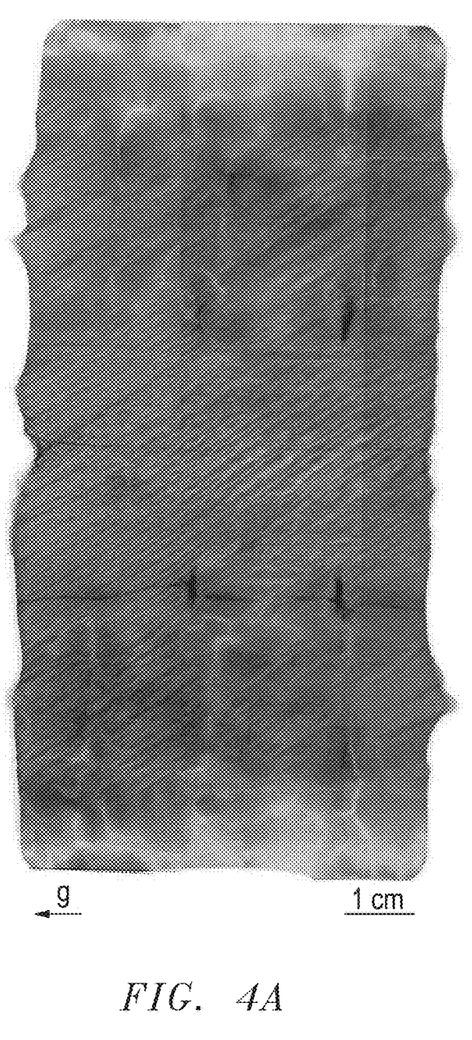
FIG. 4A includes an XRT image of Sample 2 of the Example section, after conformal bending but before annealing.
Figure 4B:
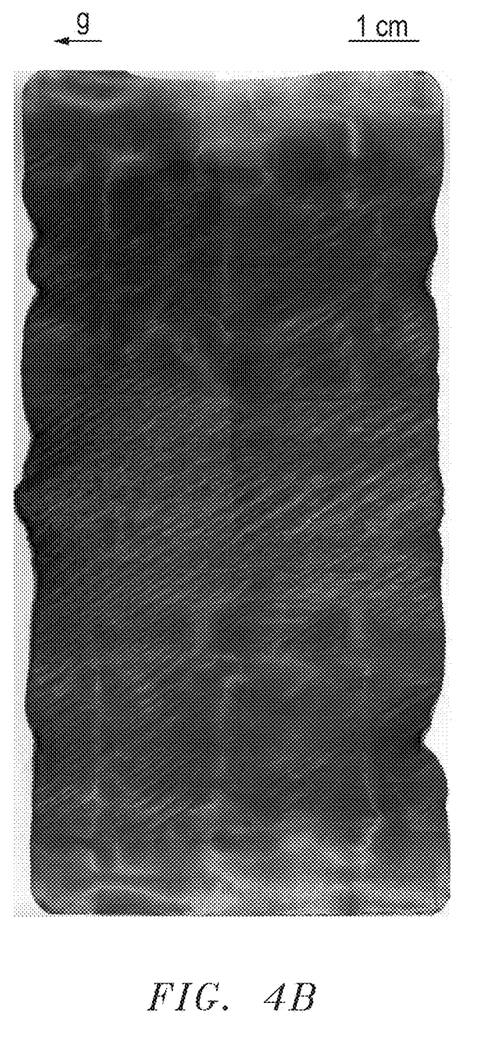
FIG. 4B includes an XRT image of Sample 2 of the Example section, after bending and annealing.

FIG. 3 includes a photograph of Sample 2, which was a bent, polished sapphire panel, similar to Sample 1 with the m-axis parallel to the long edge and having a thickness before bending of about 0.076 cm, but Sample 2 was subjected to conformal bending. FIG. 4A includes an XRT image of Sample 2 before annealing, and FIG. 4B includes an XRT image of Sample 2 after annealing at 1850° C. for 8 hours. In FIGS. 4A and 4B, a significant amount of pyramidal slip, identified by the diagonal lines running through the images, were observed. Further, a significant increase in overall dislocation density was observed, and only the top and the bottom of the images showed regions of low dislocation density, identified by the light gray regions in the image. There was minimal change in the microstructure of Sample 2 after annealing. Notably, the slip regions, strain, and dislocation density variation were still visible in the XRT images after the annealing treatment.

Figure 5:
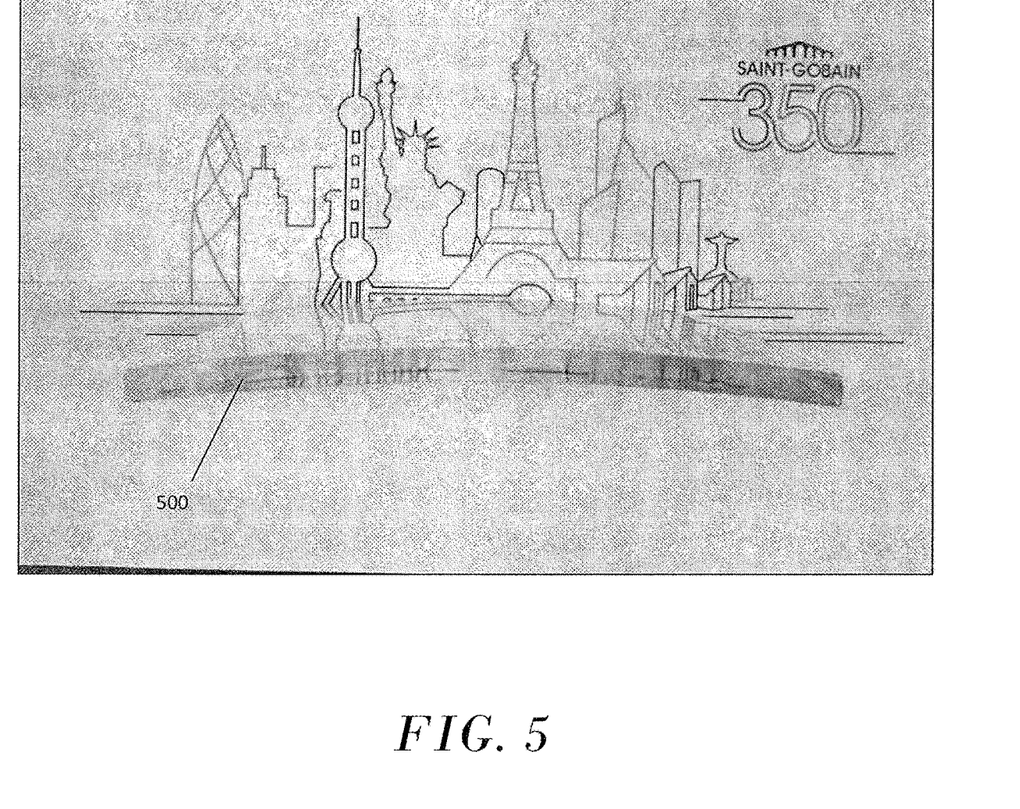
FIG. 5 includes a photograph of Sample 3 of the Example section.
Figure 6A:
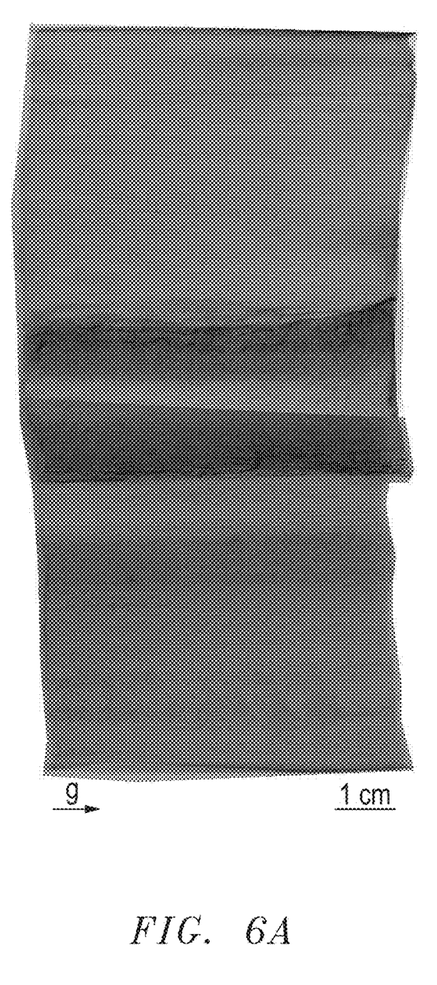
FIG. 6A includes an XRT image of Sample 3 of the Example section, after bending but before annealing.
Figure 6B:
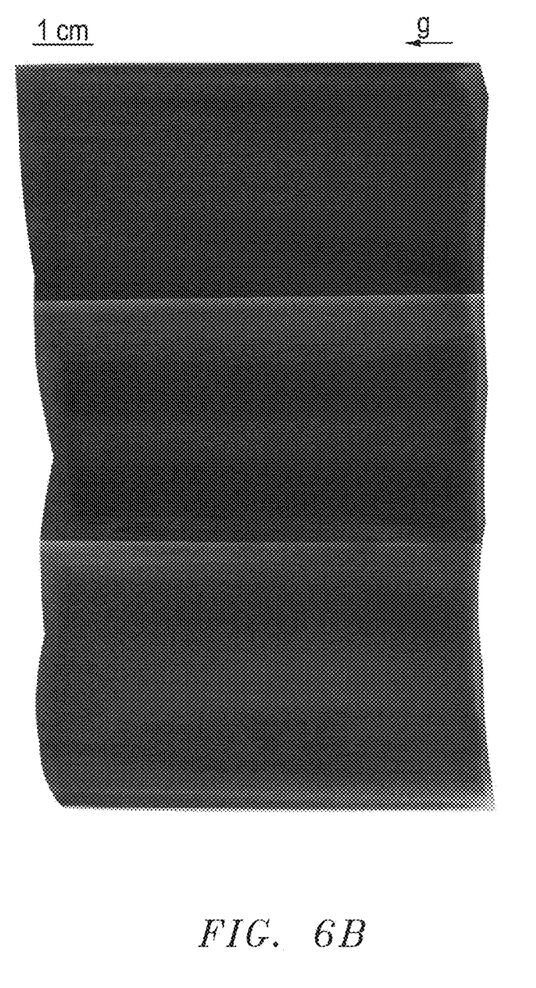
FIG. 6B includes an XRT image of Sample 3 of the Example section, after bending and annealing.

FIG. 5 includes a photograph of Sample 3, which was a bent, polished sapphire panel having a thickness of about 0.6 cm before bending. FIG. 6A includes an XRT image of Sample 3 before annealing at 1850° C. for 8 hours, and FIG. 6B includes an XRT image of Sample 3 after annealing. In FIGS. 6A and 6B, the slip bands and dislocation lines were horizontal, parallel to the short edge. There was minimal change in the microstructure of Sample 3 after annealing.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

The invention claimed is:

1. A ceramic product comprising:
    a transparent ceramic panel, wherein the transparent ceramic panel comprises:
        a top surface;
        a bottom surface, wherein the top surface and the bottom surface have a non-planar geometry; and
        a bend having a dislocation density variation localized at the apex of the bend,
    wherein the transparent ceramic panel comprises a sapphire, an AlON, or a spinel, and wherein the transparent ceramic panel has a length greater than a width.

2. The ceramic product of claim 1, wherein the non-planar geometry includes at least two bends.

3. The ceramic product of claim 1, wherein the ceramic product is polished.

4. The ceramic product of claim 1, wherein the ceramic product includes a transparent ceramic material comprising a sapphire.

5. The ceramic product of claim 4, wherein the sapphire comprises a major surface that lies along an a-plane or a c-plane.

6. The ceramic product of claim 1, wherein the non-planar geometry has a radius of curvature of no greater than 120 cm.

7. The ceramic product of claim 1, wherein the transparent ceramic panel, prior to bending, has a length of at least 30 cm.

8. The ceramic product of claim 1, wherein the transparent ceramic panel, prior to bending, has a width of at least 10 cm.

9. The ceramic product of claim 1, wherein the ceramic product includes a region of low dislocation density and a region of high dislocation density, wherein the region of high dislocation density has a dislocation density of at least $10^8$ dislocation lines per $cm^2$.

10. The ceramic product of claim 9, wherein the region of low dislocation density has a dislocation density of at most 500 dislocation lines per $cm^2$.

11. The ceramic product of claim 6, wherein the radius of curvature extends greater than 70% of a length of the ceramic product.

12. The ceramic product of claim 1, wherein the non-planar geometry has a radius of curvature of no greater than 100 cm.

13. The ceramic product of claim 1, wherein the non-planar geometry has a radius of curvature of no greater than 30 cm.

14. The ceramic product of claim 1 having a thickness variation localized at the apex of the bend.

15. The ceramic product of claim 14, wherein the thickness variation includes a thickness that decreases approaching an apex of the bend.

16. The ceramic product of claim 14, wherein the ceramic product includes a transparent ceramic material comprising a sapphire.

17. The ceramic product of claim 1, wherein the bend exhibits a slippage plane.

* * * * *

UNITED STATES PATENT AND TRADEMARK OFFICE
CERTIFICATE OF CORRECTION

| | | |
|---|---|---|
| PATENT NO. | : 10,875,812 B2 | Page 1 of 1 |
| APPLICATION NO. | : 15/294375 | |
| DATED | : December 29, 2020 | |
| INVENTOR(S) | : Drew T. Haven et al. | |

It is certified that error appears in the above-identified patent and that said Letters Patent is hereby corrected as shown below:

On the Title Page

In Column 1, item [56], page 2, Line 11, delete "Langsdort et al." and insert --Langsdorf et al.--

Signed and Sealed this
Eighth Day of November, 2022

Katherine Kelly Vidal
*Director of the United States Patent and Trademark Office*